(12) United States Patent
McCamey et al.

(10) Patent No.: US 9,551,772 B2
(45) Date of Patent: Jan. 24, 2017

(54) ORGANIC MAGNETIC FIELD SENSOR

(75) Inventors: Dane McCamey, Annandale (AU);
Christoph Boehme, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 777 days.

(21) Appl. No.: 13/978,638

(22) PCT Filed: Jan. 6, 2012

(86) PCT No.: PCT/US2012/020531
§ 371 (c)(1),
(2), (4) Date: Aug. 26, 2013

(87) PCT Pub. No.: WO2012/094624
PCT Pub. Date: Jul. 12, 2012

(65) Prior Publication Data
US 2014/0306709 A1    Oct. 16, 2014

Related U.S. Application Data

(60) Provisional application No. 61/430,489, filed on Jan. 6, 2011.

(51) Int. Cl.
G01R 33/60    (2006.01)
G01R 33/12    (2006.01)
G01R 33/09    (2006.01)

(52) U.S. Cl.
CPC ............ *G01R 33/60* (2013.01); *G01R 33/09* (2013.01); *G01R 33/1284* (2013.01)

(58) Field of Classification Search
CPC ...... G01R 33/60; G01R 33/09; G01R 33/1284
See application file for complete search history.

(56) References Cited

U.S. PATENT DOCUMENTS

| 6,418,048 | B1 | 7/2002 | Sin et al. | |
|---|---|---|---|---|
| 2002/0064005 | A1 | 5/2002 | Arasawa et al. | |
| 2002/0093331 | A1* | 7/2002 | Rochelle | G08B 21/0263 324/247 |
| 2002/0130312 | A1* | 9/2002 | Yu | B82Y 10/00 257/2 |
| 2003/0112564 | A1 | 6/2003 | Granstrom | |

(Continued)

OTHER PUBLICATIONS

McCamey, et al.; Hyperfine-Field-Mediated Spin Beating in Electrostatically Bound Charge Carrier Pairs; The American Physical Society; 4 pages; Jan. 8, 2010; vol. 104, No. 017601.

(Continued)

*Primary Examiner* — David Gray
*Assistant Examiner* — Laura Roth
(74) *Attorney, Agent, or Firm* — Thorpe North & Western, LLP

(57) ABSTRACT

An organic, spin-dependent magnetic field sensor (10) includes an active stack (12) having an organic material with a spin-dependence. The sensor (10) also includes a back electrical contact (14) electrically coupled to a back of the active stack (12) and a front electrical contact (16) electrically coupled to a front of the active stack (12). A magnetic field generator (18) is oriented so as to provide an oscillating magnetic field which penetrates the active stack (12).

18 Claims, 7 Drawing Sheets

(56) References Cited

U.S. PATENT DOCUMENTS

| | | | |
|---|---|---|---|
| 2006/0091991 A1* | 5/2006 | Wohlgenannt | G01R 33/09 338/13 |
| 2007/0069640 A1* | 3/2007 | Okunaka | H01L 51/0025 313/504 |
| 2008/0123222 A1 | 5/2008 | Daughton et al. | |
| 2010/0033175 A1* | 2/2010 | Boeve | B82Y 25/00 324/252 |
| 2010/0140109 A1 | 6/2010 | Crawford | |

OTHER PUBLICATIONS

Jander, et al.; "Sensitivity analysis of magnetic field sensors utilizing spin-dependent recombination in silicon diodes;" Solid-State Electronics; 2010; vol. 54; 1479-1484.

Janger, et al.; "Solid-state magnetometer using electrically detected magnetic resonance"; Journal of Magnetism and Magnetic Materials vol. 322 (2010) 1639-1641.

Honig, et al.; "Precison absolute measurements of strong and highly inhomogeneous magnetic fields"; Rev. Sci. Instrum. 49(2), Feb. 1978; 5 pages.

\* cited by examiner

ORGANIC MAGNETIC FIELD SENSOR

RELATED APPLICATION

This application claims priority to U.S. Provisional Application No. 61/430,489, filed Jan. 6, 2011 which is incorporated herein by reference.

GOVERNMENT INTEREST

This invention was made with government support under Grant No. DE-SC0000909 awarded by the U.S. Department of Energy. The government has certain rights in the invention.

BACKGROUND

Various systems use devices based on magnetic materials, such as computers, computing components, memory, and so forth. Magnetization of materials can result in use of less electrical power and storage of information even when the electrical power is removed. Magnetic sensors can sense magnetic fields and provide output signals representing the magnetic fields.

Recently, ferromagnetic thin-films and other layers have been developed which can yield a magnetoresistive response in the range of an order of magnitude or more as compared with the magnitude of the magnetic field due to anisotropic magnetoresistive response. This response is sometimes called a "spin valve effect" because electrons are allowed to move more freely from one ferromagnetic thin-film layer to another if the magnetizations in these layers are parallel as opposed to non-parallel orientations.

Magnetic field sensors have an extremely wide range of application. Such sensors can be used widely in scientific and research communities in areas as diverse as magnetic resonance imaging and fundamental physics. Such sensors can also employed, for example, in the mining industry for conducting wide area surveys, and even for ground tracking in airports. Magnetic field sensors have been developed with dimensions ranging from a few microns to tens of microns which can provide a response to the presence of very small external magnetic fields. Some such sensors have been developed which utilize the spin valve effect, or the changes in material properties as an effect of a magnetic field on an electron spin in the material. An electron spin is an intrinsic property of electrons. Electrons have intrinsic angular momentum. The angular momentum or spin of an electron can be an up or down spin. Previous magnetic field sensors have been able to measure magnetic fields using the electron spin properties, but such sensors have had limited accuracy, experience signal drift, operate at limited temperature ranges, and suffer from material degradation which also negatively affects sensor accuracy and performance. Further, such sensors have often been expensive and difficult to fabricate and provide effective magnetic field sensing only when oriented at a specific angle or small range of angles with respect to a direction of the magnetic field.

There is a wide range of research activity associated with magnetic field sensors. A number of proposals to use spin dependent electronic processes in inorganic semiconductors exist. See, for example, A Honig & M Moroz, Precision absolute measurements of strong and highly inhomogeneous magnetic fields, *Review of Scientific Instruments* 49,183 (1978) and A. Jander & P. Dhagat, Solidstate magnetometer using electrically detected magnetic resonance, *Journal of Magnetism and Magnetic Materials* 322, 1639-1641 (2010), both of which references are incorporated by reference herein in their entirety. However, these processes result in very small current changes at moderate magnetic fields, whilst not providing benefits of organic semiconductors, such as flexibility and cost effectiveness. Some efforts have also been made to use magnetoresistive effects in organic semiconductors as field sensors. However, such approaches are limited to small magnetic fields (i.e., <50 mT), and these approaches do not provide an absolute measurement of the field. In these approaches, the sensor output, usually the resistance of the sample, in a fixed magnetic field varies with both temperature and device current.

SUMMARY

An organic, spin-dependent magnetic field sensor includes an active stack having an organic material with a spin-dependent physical process. The sensor also includes a back electrical contact electrically coupled to a back of the active stack and a front electrical contact electrically coupled to a front of the active stack. A magnetic field generator can be associated with the active stack such that the generator is capable of generating an oscillating magnetic field in the active stack. For example, a metallic spin-resonance line can be oriented so as to provide an oscillating magnetic field which penetrates the active stack. The sensor can also include an optional substrate for supporting the active stack and contacts. The metallic spin-resonance line can be oriented above, below or otherwise adjacent to the stack oriented in a position sufficient to allow generation of the oscillating magnetic field. Other magnetic field generators can include coils, movable permanent magnets, and the like.

The metallic spin-resonance line may comprise a spin resonance line which is resonant to enable high-precision measurements in a small bandwidth. The spin resonance line can cause magnetic resonant excitation of charge carrier spins within the active stack. For example, the spin resonance line can be embedded in an RC circuit. The metallic spin line may also comprise a non-resonant spin-resonance line to cause modulation of a target magnetic field and enable broadband measurements. The metallic spin-resonance line may comprise a metallic loop in proximity to the active stack and is operable to drive spin resonance in the active stack. Optionally, the magnetic field generator can include a spin resonant conductive strip line and a lock-in amplifier conductive strip line. Each of the spin resonant conductive strip line and the lock-in amplifier conductive strip line can be electrically insulated from one another. The lock-in amplifier can have a reference frequency which is provided by the low frequency AC current in the lock-in strip line. The lock-in detected current change is then measured as a function of the RF-frequency applied to the spin resonant strip line. In some cases the magnetic field generator is further configured to produce an offset field parallel to the oscillating magnetic field, or perpendicular to the oscillating magnetic field, or both. This can be useful to allow both the magnitude and direction of the unknown magnetic field to be measured. Such offset fields can also be used to measure small magnetic field. Since the electrical detection of magnetic resonance becomes less sensitive at magnetic fields below 2 mT, an offset field of 2 mT can allow measurements in the μT range.

The sensor can include an injection layer in the active stack for charge injection into the active stack. The injection layer can be a plurality of injection layers in the active stack between the front and back contacts and on either side of the organic material for charge injection into the active stack. Although a variety of material may be suitable, several non-limiting examples of injection layer materials can include PEDOT:PSS for holes and calcium for electrons.

The organic material in the sensor may comprise an organic layer. Perturbation of the organic layer can modify at least one of conductivity or luminescence of the organic material as a result of the spin-dependence. The organic layer may comprise a back organic layer. The sensor can further include a front organic layer in the active stack, the back organic layer being closer to the back contact than the front organic layer and the front organic layer being closer to the front contact than the back organic layer. The organic material can include at least one of polyphenylenevinylene (PPV), polythiophene, polyfluorene-vinylene (PFV), polyfluorene (PFO), polyacetylene, polypyrrole, polyaniline, cyano-polyphenylene vinylene (CN-PPV), polyphenylene ethynylene (PPE), poly(2,5 pyridine), poly(3,5 pyridine), poly(2,5-bis(3-sulfonatopropoxy)-1,4-phenylene, disodium salt-alt-1,4-phenylene) (PPP), hydrocarbon molecules, porphyrin, and phthalocyanine. In one specific aspect, the organic material can comprise poly[2-methoxy-5-(2'-ethylhexyloxy)-1,4-phenylene-vinylene] (MEH-PPV). The thickness of the organic layer can be tailored to maximize or create a change in current or luminescence on resonance sufficient to be measurable. However, as a general guideline, the thickness can range from about 1 nm to about 1000 nm, and in some cases from about 20 nm to about 200 nm.

The sensor can include an insulator between the front contact and the back contact, and between the front contact and the metallic spin line. The insulator can be configured to substantially prevent electrical shorts between the front contact, back contact, and metallic spin line.

The substrate may comprise a metal or a semiconductor selected from the group consisting of silicon, plastic, and glass, among others. The substrate may comprise a flexible or a rigid material. Typically, the substrate can be electrically non-conductive or a semiconductor.

The front and back contacts may comprise any suitable conductive material. Non-limiting examples of suitable contact materials can include metals, composites thereof, polymers, and the like. Specific non-limiting examples of such materials can include copper, gold, silver, indium tin oxide (ITO), polythiophenes, polyphenylene sulfide, polyphenylene vinylene, polyacetylenes, composites thereof, and combinations thereof. The back contact can be adjacent to the substrate, the active stack can be formed on top of the back contact, the front contact can be formed on top of the active stack, and the metallic spin line can be formed above the front contact.

In another example, an organic, spin-dependent magnetic field sensor includes a substrate, a back contact formed on the substrate, and a back injection layer formed on the back contact as part of an active stack, the injection layer being operable to inject a charge into the active stack. The sensor also includes a back organic semiconductor formed as part of the active stack on the back injection layer, the back organic semiconductor comprising an organic material having a spin-dependence. A front organic semiconductor can be formed as part of the active stack on the back organic semiconductor, the front organic semiconductor comprising an organic material having a spin-dependence. A front injection layer can be formed on the back contact as part of the active stack, the injection layer being operable to inject a charge into the active stack. The sensor can further include a front contact formed on the front injection layer, a spin resonance line formed above the front contact for providing a uniform, oscillating magnetic field which penetrates the active stack, and an insulator between the front contact and the back contact, and between the front contact and the spin resonance line for preventing electrical shorts between the front contact, back contact, and spin resonance line. Perturbation of the front and back organic semiconductors can modify at least one of conductivity or luminescence of the front and back organic semiconductors as a result of the spin-dependence.

The front and/or back contacts may comprise a transparent conductive material. The front and/or back injection layers may comprise at least one blend of organic polymers or molecules. The front and back organic semiconductors may comprise different organic materials. The front and back injection layers may also comprise different organic materials.

The spin-dependency of the organic material can include all or at least one of: polaron pair recombination or dissociation, triplet-triplet annihilation, triplet-polaron recombination or annihilation, polaron-polaron spin blockade, and triplet-trion recombination.

The sensor can further include a Hall sensor for identifying a range of a magnetic field. The organic, spin-dependent magnetic field sensor can more specifically identify the magnetic field within the range identified by the Hall sensor.

A method for identifying a target magnetic field can include positioning an organic, spin-dependent magnetic field sensor near the magnetic field; applying a uniform, oscillating magnetic field to a spin resonance line on the magnetic field sensor, wherein the uniform, oscillating magnetic field penetrates an active stack of the magnetic field sensor; sweeping the uniform, oscillating magnetic field across a range of magnetic field frequencies; applying an electrical current through the active stack; measuring the electrical current while sweeping the uniform, oscillating magnetic field across the range of magnetic field frequencies, wherein conductivity of the active stack changes as the uniform, oscillating magnetic field changes; and identifying the target magnetic field when changes to the conductivity of the active stack are the greatest.

Positioning the organic, spin-dependent magnetic field sensor near the magnetic field may comprise positioning the organic, spin-dependent magnetic field sensor at any angle with respect to a direction of the magnetic field. For example, a plurality of sensors can be oriented so as to produce a system which is sensitive to magnetic fields in almost any direction. Three sensors which produce the oscillating magnetic field in complimentary perpendicular directions can allow for detection of magnetic fields in any direction. As such, a magnetic field sensor system can comprise at least three organic, spin-dependent magnetic field sensors. Each of the at least three organic, spin-dependent magnetic field sensors includes mutually perpendicular oscillating magnetic fields to form an omni-directional vector magnetometer. Note that the lock-in detection of the magnetic resonance condition will limit the device sensitivity to the $B_0$ component which is parallel to the modulation field and possible offset field $B_m + B_{off}$. Thus, by integration of three thin film sensors with mutually perpendicular modulation field directions on a single substrate, an organic thin-film based vector magnetometer with a sensitivity in the sub 100 nT range can be formed. An all thin film design of the sensors, a large number of sensors can be accommodated on a single substrate at low cost for the purpose of magnetic field gradients.

The method can further include identifying the range of magnetic field frequencies as a subset of a larger range of frequencies using a Hall sensor and/or strengthening the electrical current using at least one injection layer in the active stack. The method can also include identifying the target magnetic field within a 100 nm positional accuracy and/or measuring spatially varying target magnetic fields using an array of organic spin-dependent magnetic field sensors. Other aspects of the method can include flexing the magnetic field sensor around an object to enhance identification of the target magnetic field, and/or identifying the target magnetic field at room temperature or cryogenic temperatures.

The conductivity of the active stack can change as a frequency of the oscillating magnetic field approaches a frequency of the target magnetic field and causes resonance in the organic spin-dependent magnetic field sensor. Although the oscillating magnetic field may be uniform, this is not required as long as non-uniformities are compensated for and the frequency is sufficiently well defined to allow identification of the resonance frequency. Identifying the target magnetic field may comprise calculating the target magnetic field B according to the relationship B=$\alpha$f, where f is a frequency of the oscillating magnetic field and $\alpha$ is an organic material constant that is constant in temperature and applied current in some materials, or has a well defined dependence on temperature and current in other materials. Using the collected information, the target magnetic field may be identified using frequency dependence of target magnetic field strength to identify the resonant target magnetic field.

A method for fabricating an organic, spin-dependent magnetic field sensor can include lithographically depositing a back contact comprising an electrical contact; lithographically depositing an active stack comprising an organic material having a spin-dependence, such that a back of the active stack is electrically coupled to the back contact; lithographically depositing a front contact comprising an electrical contact such that the front contact is electrically coupled to a front of the active stack; and lithographically depositing a metallic spin line above the front contact, the metallic spin line being operable to provide an oscillating magnetic field which penetrates the active stack. Although lithography can be used, other methods can also be suitable. Non-limiting examples of alternative methods can include vapor deposition, atomic layer deposition, ink-jet printing, reel-to-reel printing and the like.

DETAILED DESCRIPTION

Figure 1:
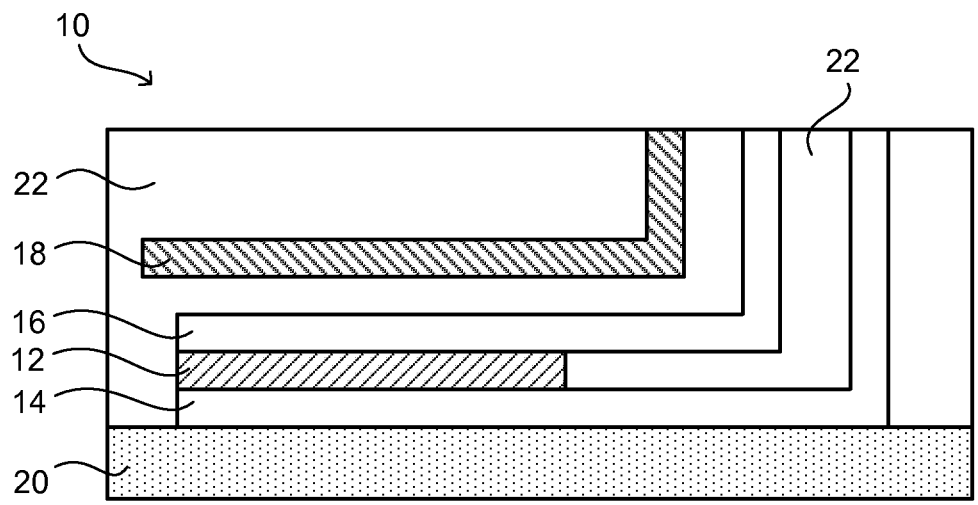
FIG. 1 is a side cross-sectional view of an organic, spin-dependent magnetic field sensor in accordance with an embodiment of the present technology.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

As used herein, "electrically coupled" refers to a relationship between structures that allows electrical current to flow at least partially between them. This definition is intended to include aspects where the structures are in physical contact and those aspects where the structures are not in physical contact. Typically, two materials which are electrically coupled can have an electrical potential or actual current between the two materials. For example, two plates physically connected together by a resistor are in physical contact, and thus allow electrical current to flow between them. Conversely, two plates separated by a dielectric material are not in physical contact, but, when connected to an alternating current source, allow electrical current to flow between them by capacitive means. Moreover, depending on the insulative nature of the dielectric material, electrons may be allowed to bore through, or jump across the dielectric material when enough energy is applied.

As used herein, "adjacent" refers to near or close sufficient to achieve a desired effect. Although direct physical contact is most common in the structures or volumes of the present invention, adjacent can broadly allow for spaced apart features.

As used herein, the term "substantially" refers to the complete or nearly complete extent or degree of an action, characteristic, property, state, structure, item, or result. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect on the property of interest thereof.

As used herein, the term "about" is used to provide flexibility to a numerical range endpoint by providing that a given value may be "a little above" or "a little below" the endpoint with a degree of flexibility as would be generally recognized by those skilled in the art. Further, the term about explicitly includes the exact endpoint, unless specifically stated otherwise.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation can apply regardless of the breadth of the range or the characteristics being described.

Spin-dependent transitions can be used for magnetic resonance detection schemes. Described herein is an offset-, calibration- and degradation-free magnetic field sensor based on spin-dependent electronic transitions in organic semiconductors. Combining both, offset-, calibration- and degradation-free magnetic resonance detection schemes and organic semiconductors combines the benefits of organic devices (flexibility, cost, etc.) along with a precise way to determine the magnetic field. In the past, organic magnetic field sensors used a magnetoresistive effect which needs to be calibrated, and which often varies with temperature, age etc. Using spin resonance on spin-dependent transitions can overcome these problems.

The technology encompasses the use of spin dependent electronic transitions in organic semiconductors to measure a local magnetic field. Using a material with such transitions, magnetic fields can be measured by determining the frequency required to drive spin resonance, through the relationship $B=\alpha f$, where f is the frequency, B the magnetic field and $\alpha$ is a proportionality factor which can be easily determined experimentally. The frequency is determined by monitoring the device resistance, which changes when the resonance conditions are satisfied. The technology can be used over a large range of magnetic fields and temperatures, including room temperature, and can be used to determine absolute magnetic fields with an absolute accuracy better than 1 part in $10^4$. Organic semiconductors can be fabricated on flexible substrates, which may allow fabrication of conformal sensors.

Experimental use of the technology demonstrates that spin dependent processes exist in an organic semiconductor (such as, MEH-PPV). These transitions have been used to experimentally measure magnetic fields in the kGauss range, and also for field sensing in the range 10-3500 Gauss (1 Gauss is approximately the Earths' magnetic field). The g-factor of these transitions, which is related to the proportionality factor $\alpha$, does not vary with temperature or applied voltage.

This technology incorporates an absolute magnetic field sensor based on organic semiconductors which measures magnetic fields with high accuracy without drift due to environmental changes over large temperature ranges (including room temperature) or due to materials degradation. The sensor utilizes spin-dependent electronic transitions which are capable of producing percentage changes in the current through the device when spin resonance conditions are satisfied. By incorporating a high precision single-frequency source, the external magnetic field, B, can be accurately determined by the relationship $B=\alpha f$, where f is the frequency required to observe the resonant change. In particular in organic materials, $\alpha$ is constant in both temperature and applied current, resulting in a sensor capable of providing high precision measurements of magnetic field without the need for calibration.

Organic semiconductors provide a number of advantages. For example, organic semiconductors can be cheap, easy to fabricate, and can be made on flexible substrates. Flexibility may allow the development of conformal field sensors. The position accuracy of the current technology can be as low as 100 nm. Coupling small size with electrical readout, arrays of sensors can be incorporated for measuring spatially varying magnetic fields. The sensor can measure magnetic fields at least in a millisecond to second time range, if not much faster.

Referring to FIG. 1, an organic, spin-dependent magnetic field sensor 10 includes an active stack 12 having an organic material with a spin-dependence. The sensor 10 also includes a back electrical contact 14 electrically coupled to a back of the active stack 12 and a front electrical contact 16 electrically coupled to a front of the active stack 12. A metallic spin line 18 can be above the front contact 16 and provides an oscillating magnetic field which penetrates the active stack 12. Although FIG. 1 illustrates the metallic spin line 18 above the front contact 16, the metallic spin line or other magnetic field generator can be oriented in any location which allows for generation of a magnetic field within or through the active stack 12.

The sensor 10 can also include an optional substrate 20 for supporting the active stack 12 and contacts 14 and 16. The substrate can support the various contacts, organic layers, and so forth. The back contact can allow electrical contact to the active part of the device. The organic layer may comprise an organic material as will be outlined below, in which a spin-dependent process exists which can modify the conductivity or luminescence of the material when perturbed. Such processes include but are not limited to polaron pair recombination or dissociation, triplet-triplet annihilation, triplet-polaron recombination or annihilation and triplet-trion recombination.

The front contact is intended to allow electrical contact to the active part of the device (i.e., the active stack). An insulating material 22 can be configured to substantially prevent electrical shorts between the front contact, back contact and spin resonance line or magnetic field generator. A spin resonance line can be used to provide an oscillating magnetic field which penetrates the active stack, and is used to drive spin resonance. The spin resonance line can be resonant or non-resonant. A non-resonant line allows for broad band operation, whereas a resonant line allows for high-precision measurements in a small bandwidth.

Figure 2:
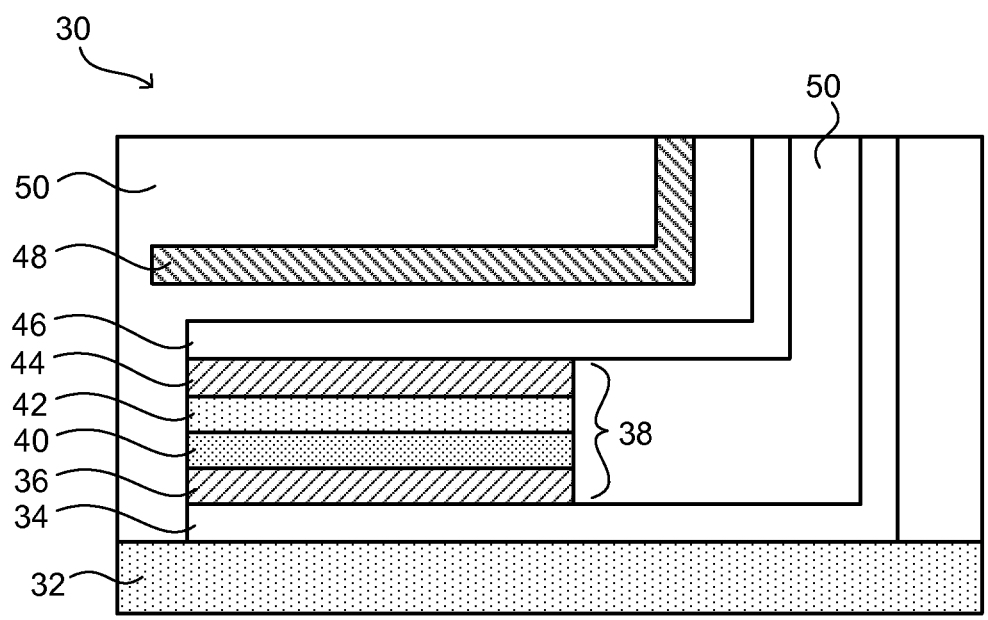
FIG. 2 is a side cross-sectional view of an organic, spin-dependent magnetic field sensor including injection layers in accordance with an embodiment of the present technology.

Referring to FIG. 2, an organic, spin-dependent magnetic field sensor 30 includes a substrate 32, a back contact 34 formed on the substrate, and a back injection layer 36 formed on the back contact as part of an active stack 38, the injection layer being operable to inject a charge into the active stack. The sensor 30 also includes a back organic semiconductor 40 formed as part of the active stack 38 on the back injection layer 36, the back organic semiconductor comprising an organic material having a spin-dependence. A front organic semiconductor 42 can be formed as part of the active stack 38 on the back organic semiconductor 40, the front organic semiconductor comprising an organic material also having a spin-dependence. A front injection layer 44 can be formed on the back contact 34 as part of the active stack 38, the injection layer being operable to inject a charge into the active stack. The sensor 30 can further include a front contact 46 formed on the front injection layer 44. A spin resonance line 48 formed above the front contact 46 can provide an oscillating magnetic field (typically uniform, although not absolutely required) which penetrates the active stack 38. An insulator 50 is oriented between the front contact 46 and the back contact 34, and between the front contact and the spin resonance line 48 for preventing electrical shorts between the front contact, back contact, and spin resonance line. Perturbation of the front organic semiconductor 40 and back organic semiconductor 42 can modify at least one of conductivity or luminescence of the front and back organic semiconductors as a result of the spin-dependence.

The second or front organic layer can be optional in the device. This layer, as well as additional organic layers if desired, can be used to increase the current change through an engineered stack of different organic materials. The injection layer(s) is/are also optional. An injection layer is intended to assist with charge injection if present. The injection layer can include materials such as those indicated below. The organic semiconductor(s) and any injection layers together can form an active stack.

Figure 3:
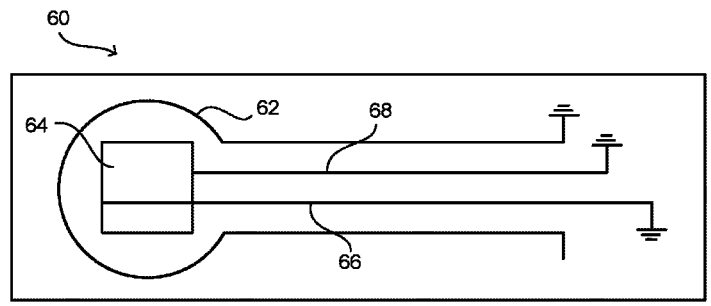
FIG. 3 is a schematic top view of an organic, spin-dependent magnetic field sensor in accordance with an embodiment of the present technology.

FIG. 3 illustrates a schematic top view of an organic, spin-dependent magnetic field sensor 60 in accordance with an embodiment of the present technology. In this example, the spin resonance line 62 is shown as a metallic loop substantially surrounding the active stack 64. A front contact 66 and a back contact 68 can be used to complete a circuit about the active stack 64.

Figure 4A:
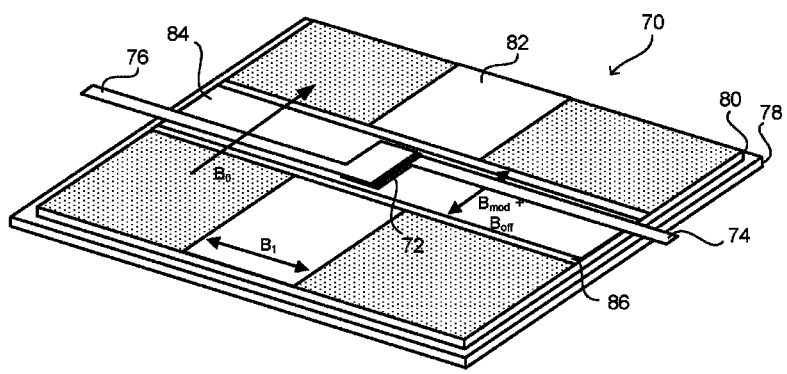
FIG. 4A is a schematic perspective view of a magnetic sensor having a two part magnetic field generator in accordance with an embodiment of the present technology.

FIG. 4A is a schematic top view of another magnetic field sensor 70 which includes a two part magnetic field generator. In this configuration, the active stack 72 is sandwiched between a back contact 74 and a front contact 76. The sensor can be supported on a substrate 78. Optional insulating layers 80 (e.g. $SiN_x$) can be used to further electrically isolate the sensor from underlying substrate, adjacent devices, and/or materials. The magnetic field generator in this case can include a spin resonant strip line 82 for high frequency magnetic field to cause excitation of charge carrier spins. A second strip line 84 can be used as part of a lock-in amplifier to which a low frequency AC current is applied. The spin resonant strip line 82 produces magnetic field B1 while second strip line 84 produces magnetic field Bm. An insulator layer 86 can be oriented between the spin resonant line 82 and the second strip line 82 to maintain the two lines electrically insulated from one another.

Figure 4B:
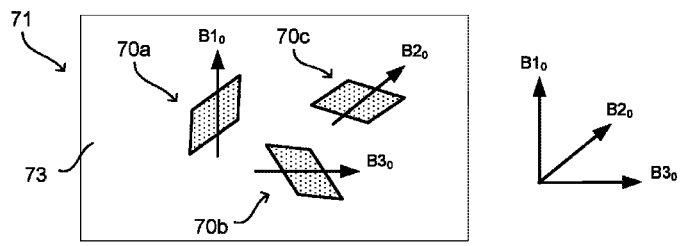
FIG. 4B is a schematic top view of a magnetic sensor system having three organic, spin-dependent magnetic field sensors with mutually perpendicular oscillating magnetic fields in accordance with an embodiment of the present technology.

FIG. 4B shows a magnetic sensor system 71 having three organic, spin-dependent magnetic field sensors (70a, 70b, and 70c) with mutually perpendicular oscillating magnetic fields ($B1_0$, $B2_0$ and $B3_0$, respectively). The sensors are oriented on a single substrate 73 to form an omni-directional vector magnetometer.

The substrate may be any material which a device can be fabricated on and which has the desired mechanical integrity for a given application. The substrate may be rigid or flexible. Non-limiting examples of such materials include metal, semiconductors such as silicon, plastic or glass. Additionally specific, but non-limiting examples of suitable substrates include glass, silicon, silicon dioxide, germanium, gallium arsenide, indium phosphide, aluminum oxide, alloys thereof, and composites thereof.

The insulating layers can be fabricated of any insulating material compatible with the fabrication method used. For example, silicon nitride and other ceramics or plastics can be suitable.

The contact layers can be any material with a sufficiently high conductivity to provide current flow to and from the active stack. Non-limiting examples of suitable conductors include metals (e.g. gold, silver, aluminum, etc), transparent conductive materials such as ITO, and a polymeric conductor.

The injection layers and organic layer or layers can consist of one of, or more than one of, or blends of organic polymers or molecules. These include, but are not limited to, the following materials or materials which include derivatives thereof:

Polyphenylenevinylene (PPV) or derivatives or related materials such as: MDMO-PPV: Poly[2-methoxy-5-(3',7'-dimethyloctyloxy)-1,4-phenylenevinylene], MEH-PPV: Poly[2-methoxy-5-(2-ethylhexyloxy)-1,4-phenylenevinylene], PSS PPV-co-MEH PPV: $[(C_{40}H_{76}O_{14}Si_8)_x(C_{16}H_{22}O_2)_y]$, Poly(1-methoxy-4-(O-disperse Red 1))-2,5-phenylenevinylene, BTEM-PPV: [Poly[2,5-bis(triethoxymethoxy)-1,4-phenylene vinylene], Poly(2,5-bis(2-(2-(2-methoxyethoxy)ethoxy)ethoxy)-1,4-phenylenevinylene)], Poly(2,5-dihexyloxy-1,4-phenylenevinylene), Poly(2,6-naphthalenevinylene), Poly[(m-phenylenevinylene)-alt-(2,5-dihexyloxy-p-phenylenevinylene)], Poly[1-methoxy-4-(3-propyloxy-heptaisobutyl-PSS)-2,5-phenylenevinylene], Poly[2,5-bis(3',7'-dimethyloctyloxy)-1,4-phenylenevinylene], Poly[2-methoxy-5-(2-ethylhexyloxy)-1,4-phenylenevinylene], and PTDPV: Poly[tris(2,5-bis(hexyloxy)-1,4-phenylenevinylene)-alt-(1,3-phenylenevinylene)].

Polythiophene or derivatives or related materials such as: P3BT: Poly(3-butylthiophene-2,5-diyl), $P_3C_4MT$: Poly(3-cyclohexyl-4-methylthiophene-2,5-diyl), $P_3CHT$: Poly(3-cyclohexylthiophene-2,5-diyl), Poly(3-decyloxythiophene-2,5-diyl), P3HT: Poly(3-hexylthiophene-2,5-diyl), P3OT: Poly(3-octylthiophene-2,5-diyl), POT-co-DOT: Poly(3-octylthiophene-2,5-diyl-co-3-decyloxythiophene-2,5-diyl), Poly(thiophene-2,5-diyl), PODT: Poly[(2,5-didecyloxy-1,4-phenylene)-alt-(2,5-thienylene)], EDOT: 3,4-Ethylenedioxythiophene, and PEDOT: Poly(3,4-ethylenedioxythiophene).

Polyfluorene-Vinylene (PFV) or derivatives or related materials such as: PFV: Poly(9,9-di-(2-ethylhexyl)-9H-fluorene-2,7-vinylene).

Polyfluorene (PFO) or derivatives or related materials such as: Poly(9,9-di-n-dodecylfluorenyl-2,7-diyl), Poly(9,9- n-dihexyl-2,7-fluorene-alt-9-phenyl-3,6-carbazole), and Poly[9,9-di-(2'-ethylhexyl)fluorenyl-2,7-diyl]. Polyacetylene or derivatives or related materials. Polypyrrole or derivatives or related materials such as: 1H-Pyrrole-1-propionic acid and EDOP: 3,4-Ethylenedioxypyrrole. Polyanilines or derivatives or related materials such as: Camphor-10-sulfonic acid (β). Cyano-Polyphenylene vinylene (CN-PPV) or derivatives or related materials such as: Poly(2,5-di(hexyloxy)cyanoterephthalylidene), Poly(2,5-di(octyloxy) cyanoterephthalylidene), and Poly(5-(2-ethylhexyloxy)-2-methoxy-cyanoterephthalylidene). Poly(phenylene ethynylene) (PPE) or derivatives or related materials such as: Poly(2,5-di(3',7'-dimethyloctyl)phenylene-1,4-ethynylene), Poly(2,5-dicyclohexylphenylene-1,4-ethynylene), Poly(2,5-di(2'-ethylhexyl)-1,4-ethynylene), Poly(2,5-didodecylphenylene-1,4-ethynylene), and Poly(2,5-dioctylphenylene-1,4-ethynylene). Poly(2,5 pyridine) or Poly(3,5 pyridine)) or derivatives or related materials. Poly(fluorenylene ehtynylene) (PFE) or derivatives or related materials such as: Poly(9,9-dioctylfluorenyl-2,7-yleneethynylene), Poly[9,9-di(2'-ethylhexyl)fluoren-2,7-yleneethynylene] and Poly[9,9-didodecylfluroenyl-2,7-yleneethylnylene]. Poly(2,5-bis(3-sulfonatopropoxy)-1,4-phenylene, disodium salt-alt-1,4-phenylene) (PPP) or other water soluble polymers. Hydrocarbon molecules, such as: Alq$_3$: Tris-(8-hydroxyquinoline)aluminium, Ir(piq)$_3$: Tris[1-phenylisoquinoline-C2,N]iridium(III), Tris(benzoylacetonato) mono(phenanthroline)europium(III), Tris(2,2'-bipyridyl-d8)ruthenium(II) hexafluorophosphate, Rubrene: 5,6,11,12-Tetraphenylnaphthacene, Perylene, Anthracene, Benz[b]anthracene, Coumarin 6: 3-(2-Benzothiazolyl)-7-(diethylamino)coumarin, 3-(2-Benzothiazolyl)-N,N-diethylumbelliferylamine, TDAB: 1,3,5-Tris(diphenylamino)benzene, TECEB: 1,3,5-Tris(2-(9-ethylcabazyl-3)ethylene)benzene, mCP: 1,3-Bis(N-carbazolyl)benzene, 1,4-Bis(diphenylamino)benzene, CBP: 4,4'-Bis(N-carbazolyl)-1,1'-biphenyl, PCBM: [6,6]-Phenyl C61 butyric acid methyl ester, PCBB: Phenyl-C$_{61}$-Butyric-Acid-Butyl Ester, PCBO: Phenyl-C$_{61}$-Butyric-Acid-Octyl Ester, ThCBM: Thienyl-C$_{61}$-Butyric-Acid-Methyl Ester, and d5-PCBM: Pentadeuterophenyl-C$_{61}$-Butyric-Acid-Methyl Ester. Porphyrin or derivatives or related materials such as: PtOEP: Platinum octaethylporphyrin and H2TPP: Tetraphenylporphyrin. Phthalocyanine or derivatives or related materials such as: Copper phthalocyanine, Lead phthalocyanine, Silicon phthalocyanine, 2,3-Naphthalocyanine and Aluminum 2,3-naphthalocyanine chloride.

Figure 5:
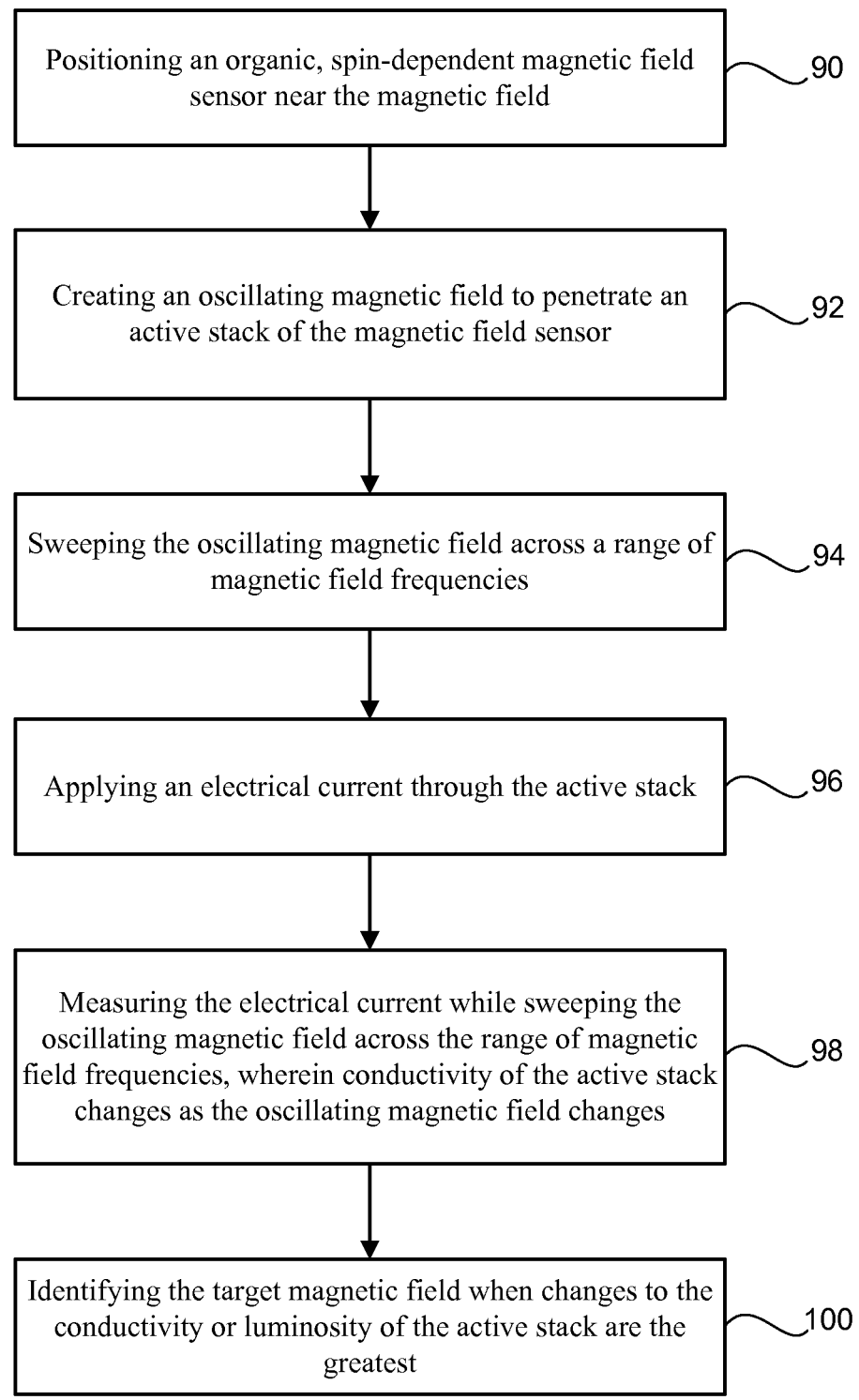
FIG. 5 is a flow diagram of a method for identifying a target magnetic field in accordance with an embodiment of the present technology.

Referring now to FIG. 5, a flow diagram of a method is shown for identifying a target magnetic field in accordance with an embodiment of the present technology. The method can include positioning an organic, spin-dependent magnetic field sensor near the magnetic field 90. Positioning the organic, spin-dependent magnetic field sensor near the magnetic field may comprise positioning the organic, spin-dependent magnetic field sensor at any non-parallel angle with respect to a direction of the magnetic field. If multiple sensors are used simultaneously, then the direction of the target magnetic field being measured is less important. An oscillating magnetic field can be created from a magnetic field generator on the magnetic field sensor 92. The uniform, oscillating magnetic field generated penetrates an active stack of the magnetic field sensor. The method also includes sweeping the uniform, oscillating magnetic field across a range of magnetic field frequencies 94. An electrical current can be applied through the active stack 96. The method then includes measuring the electrical current 98 while sweeping the uniform, oscillating magnetic field across the range of magnetic field frequencies. Consistent with the principles described herein, the conductivity of the active stack changes as the uniform, oscillating magnetic field changes. Finally, the method can include identifying the target magnetic field when changes to the conductivity or luminosity of the active stack are the greatest 100.

The method can further include identifying the range of magnetic field frequencies as a subset of a larger range of frequencies using a Hall sensor. Whereas Hall sensors are typically oriented perpendicular to a magnetic field to operate effectively, the present organic sensor can be oriented in any direction. A drawback is that a direction of the field is not known. Use of a Hall sensor can provide the direction of the field. Also, Hall sensors can be used to find a general range of frequencies within which the magnetic field exists. Hall sensors can do so fairly rapidly. However, Hall sensors do not provide an absolute measurement of a magnetic field. The present organic sensor can provide an absolute measurement of a magnetic field, but discovers the field by scanning across a range of field frequencies. Thus, a combination of a Hall sensor with the organic sensor can reduce an amount of time in measuring the magnetic field because the Hall sensor can identify a smaller range for the organic sensor to scan.

The method can include strengthening the electrical current through the active stack using at least one injection layer in the active stack. The method can also include identifying the target magnetic field within a 100 nm positional accuracy and/or measuring spatially varying target magnetic fields using an array of organic spin-dependent magnetic field sensors. Other aspects of the method can include flexing the magnetic field sensor around an object to enhance identification of the target magnetic field, and/or identifying the target magnetic field at room temperature.

The conductivity of the active stack can change as a frequency of the uniform, oscillating magnetic field approaches a frequency of the target magnetic field and causes resonance in the organic spin-dependent magnetic field sensor. Identifying the target magnetic field may comprise calculating a the target magnetic field B according to the relationship B=αf, where f is a frequency of the uniform, oscillating magnetic field and α is an organic material constant that is constant in temperature and applied current. This information can be used to identify the target resonant magnetic field using the frequency dependence of the target magnetic field strength.

Figure 6:
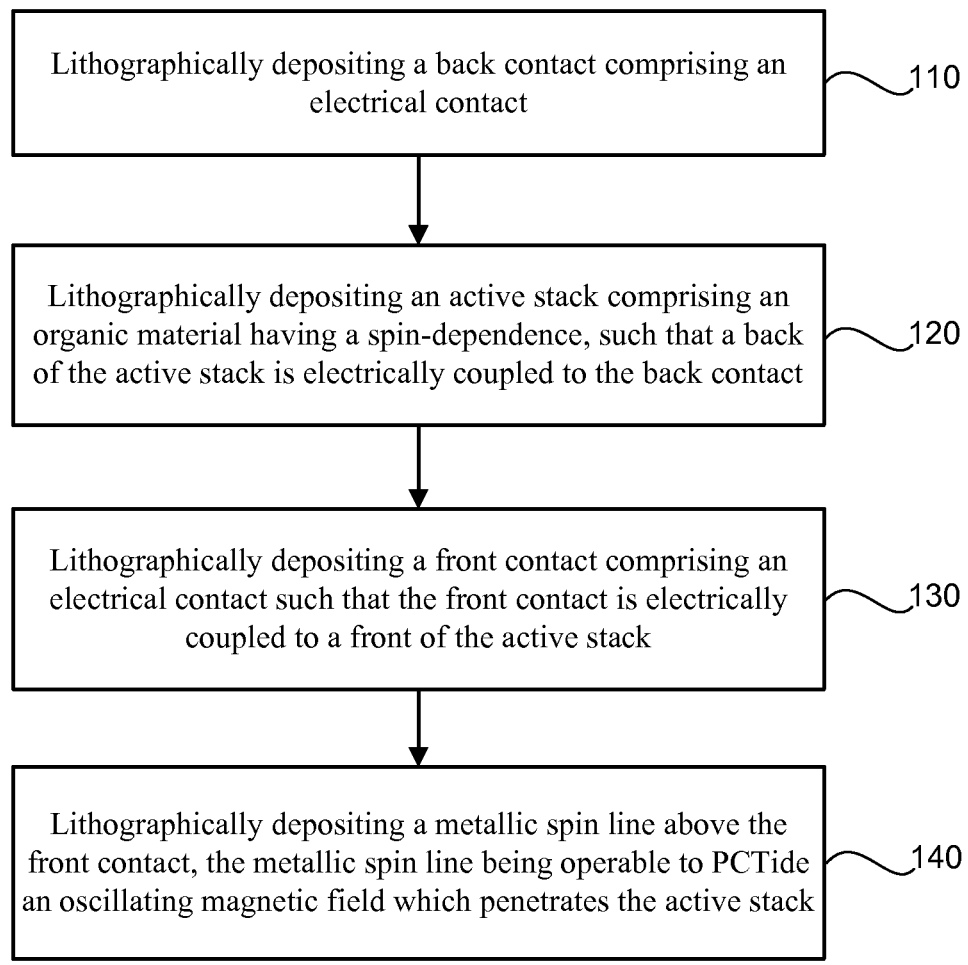
FIG. 6 is a flow diagram of a method for fabricating an organic, spin-dependent magnetic field sensor in accordance with an embodiment of the present technology.

FIG. 6 includes a flow diagram of a method for fabricating an organic, spin-dependent magnetic field sensor in accordance with an embodiment of the present technology. The method can include depositing a back contact comprising an electrical contact 110. The method can also include depositing an active stack comprising an organic material having a spin-dependence, such that a back of the active stack is electrically coupled to the back contact 120. A front contact can be deposited 130 comprising an electrical contact such that the front contact is electrically coupled to a front of the active stack. The method can also include lithographically depositing a metallic spin line above the front contact 140, the metallic spin line being operable to provide an oscillating magnetic field which penetrates the active stack. The steps of depositing can be performed using any suitable approach. For example, lithography is currently a very effective approach, although other techniques can be used such as, but not limited to, patterned deposition (ink jet printing and other additive processes), and the like.

The method can further include encapsulating the organic materials to limit degradation. Even with degradation, readings from the organic magnetic field sensor described do not exhibit drift, as with other sensors. Whilst such degradation may lead to a decrease in the amplitude of the signal seen at the resonant frequency corresponding to the target magnetic field, the relationship B=αf does not change, and thus degradation of the sensor over time may have limited impact on use of the sensor.

Lithographic fabrication of the sensor can be at the nanoscale or at larger scales. Lithographic fabrication techniques are known and are not specifically described here. Size or scale of lithographic fabrication of the sensors is practically limited by limits of lithography.

The technology described here can be of use in situations where magnetic fields need to be measured over a large dynamic range of temperature or magnetic field, where precision measurements of magnetic fields are desired, and in situations where very local field measurements (~100 nm scale) are desired. Applications for small and accurate magnetic field sensors can be found in magnetic resonance, geophysics, biophysics, and electronics. Various applications of the magnetic field sensor described are contemplated. A number of these applications have been described above. Another application is the use in magnetic resonance imaging (MRI) devices. Use of the organic field sensor in an MRI device can result in a more inexpensive and easier to use imaging device.

In one alternative example, an array of organic spin-dependent magnetic field sensors can be flexed around an object or into a specific orientation or shape to allow identification of a spatially varying magnetic field.

EXAMPLE

A sensor device was formed by depositing an active stack and electrodes consisting of the following materials: an indium tin oxide layer about 200 nm in thickness, a hole injection layer of PEDOT that was applied using a spin-coater, followed by a thin layer (about 200 nm) of MEH-PPV that was also applied via spin coating in a nitrogen rich glove box, with a ~25 nm calcium contact which layers were supported on a corning glass substrate with 50 nm thick aluminum electrical contacts for current detection. The configuration was substantially that illustrated in FIG. 4.

Figure 7:
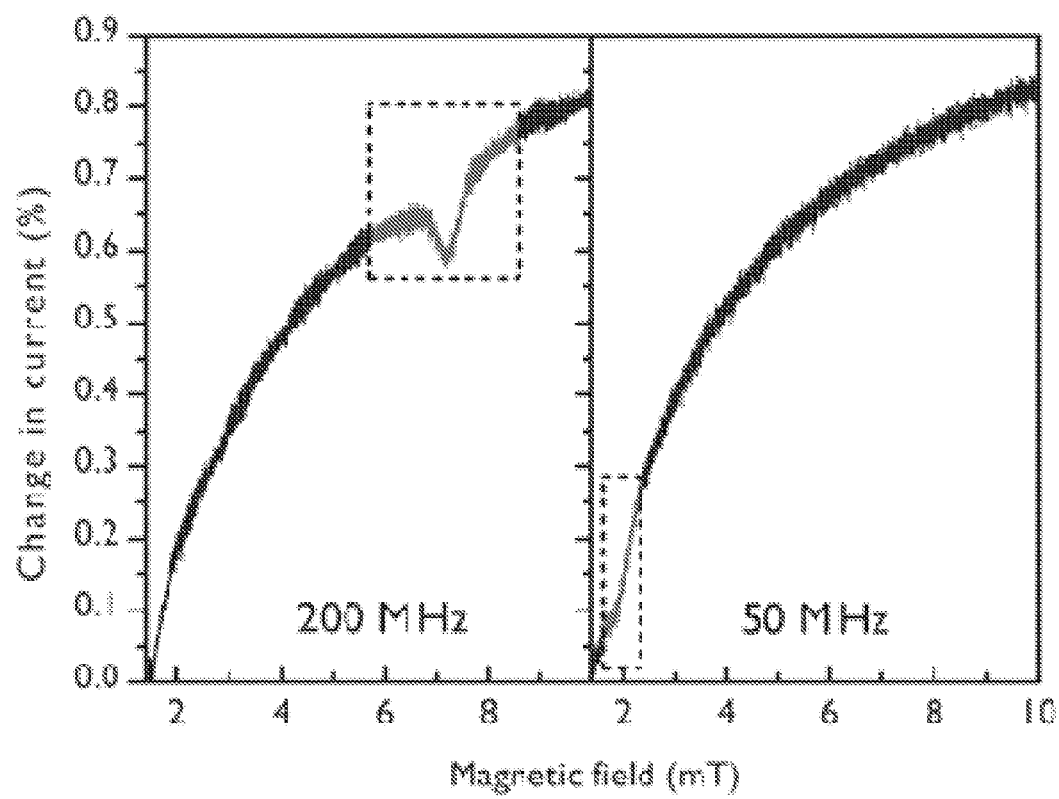
FIG. 7 is a graph of magnetic field response in a bipolar MEH-PPV current as a function of magnetic field (for $B_0$>1.35 mT), in presence of RF signals at 0.05 GHz and 0.200 GHz in accordance with an embodiment of the present technology.

Temperature dependent $\gamma_e$ data were taken with a device with a Strontium electrical contact. The device was operated in a forward bias with an isolated voltage source while placed inside a small coil. The coil was connected to a tunable frequency source for the application of a fixed frequency. The device output current was then connected to a low-noise current amplifier where a low-pass filter (10 Hz cutoff) was used with no offset current. Current was then measured as a function of magnetic field strength as shown in FIG. 7.

For single pulse experiments, the strip line resonator design was used while the sensor was operated in the forward bias mode. The output current was then connected to a low-noise current amplifier in high band-width mode with an offset current close to $I_0$. This output was then connected to an 8-bit transient recorder.

A set of Helmholtz coils were oriented perpendicular to the first coil for field modulation. A reference frequency of ~6 KHz was provided to the coils by the built-in function generator of the lock-in amplifier at ~4V amplitude providing ~0.1 mT modulation field. The in-phase output had the initial bias subtracted then was connected to a 16 bit fast digitizer card.

The resolution in measurable field can be affected by the electrical shot noise, the amplitude of the applied modulation field $B_m$ and the width of the resonance line $\Delta B$ in the following form:

$$\delta B_{min} B_m \frac{\partial^2 I}{\partial B^2} = I_{noise},$$

where
$I_{noise} = \sqrt{(2e\Delta f I_0)}$ is the shot noise; and $$\frac{\partial^2 I}{\partial B^2}$$

is the second derivative of the magnetic field dependence of the device current $I(B_0)$ which for the case of MEH-PPV is a Gaussian function $$I(B_0) = \frac{I_a B_m}{\sqrt{2\pi \Delta B}} e^{-\frac{B_0 - B_{res}}{2\Delta B}}$$

with $I_a$ being the spin-dependent on resonant signal current through the device.

$$\frac{\partial^2 I}{\partial B^2}(B_0) = \frac{I_a B_m}{2}\sqrt{\frac{2}{\pi}}\frac{1}{\Delta B^3},$$

at the center of the Gaussian distribution ($B_0=B_{res}$). Thus, the resolution spectral density is $$\frac{\delta B_{min}}{\sqrt{\Delta f}} = 2\frac{\sqrt{\pi e I_0}}{I_a}\Delta B,$$

where we have assumed that the modulation amplitude $B_m$ is set equal to the line width $\Delta B$. For the resolution estimation in the given devices, we used experimental values of $I_a$=100 nA, $I_0$=100 µA, and $\Delta B$=0.35 mT as obtained was from the fits in FIG. 8.

Magnetic resonance with either electrons or holes can be detected by a simple current measurement. FIG. 4 depicts the sensor architecture used in this example. A thin MEH-PPV layer was sandwiched between an electron and a hole injection layer. This sensor device also sits above two thin strips of conducting materials (e.g. aluminum) both of which are mutually electrically isolated as well as isolated from the active stack. The two striplines are mutually perpendicular, one is coupled to a radio frequency source, the other is subjected to an AC current that may or may not be offset by a DC component.

The active stack structure within this device is used for the measurement of spin-dependent excess charge carrier currents. The two strip lines are for the inductively non-resonant, and therefore, broad-band generation of harmonically oscillating magnetic fields. One stripline is subjected to high-frequency (lower MHz to high GHz range) radiation in order to cause magnetic resonance excitation of charge carrier spins. The other stripline is subjected to strong kHz range-AC currents with or without DC offsets which allow modulation of the external magnetic field as well as the application of an offset magnetic field, respectively.

This sensor only allows the quantitative determination of the magnetic field component that is perpendicular to the direction of the RF field ($B_1$ field) and parallel to the direction of the modulation field. This does not pose a limitation on the device per se as absolute magnetic field measurements can be accomplished by utilization of three sensor devices with mutually perpendicular measurement axis, all of which can be implemented as thin film devices on a common same substrate. In an alternative approach, three individual measurements on a single sensor containing two orthogonal offset lines can be used to determine the magnitude and direction of the magnetic field.

In order to measure the externally applied magnetic field $B_0$ with the device shown in FIG. 4, changes to a current applied to the active stack structure are monitored through a lock-in amplifier whose reference frequency is provided by the low frequency AC current in one stripline. This lock-in detected current change is then measured as a function of the RF-frequency applied to the second stripline. Once a frequency is identified at which the MR induced current change is maximized, a determination of $B_0 = v/\gamma$ is possible, with $\gamma$ being the gyromagnetic ratio of the charge carrier species that is in resonance. Unless otherwise stated, the experimental data presented in the following has been measured at room temperature.

Electrically detected spin-resonance signals are shown independent from spin-polarization over large magnetic field ranges. FIG. 7 shows measurements of a DC current in the active stack structure as a function of $B_0$ while an RF-field with constant frequency and intensity is applied. The left plot displays the relative current change $\Delta I/I$ in presence of an RF radiation ($v=200$ MHz) as a function of the magnetic field for 1.3 mT<$B_0$<10 mT. Throughout the measured range, the plot shows a monotonic increase of the sample current, a behavior which is due to strong magnetoresistance of this material in this magnetic field range. In addition to the monotonic magnetic dependence of the current, the plot shows a reduction of the sample current around $B_0 \approx 7.14$ mT, corresponding to the magnetic resonance condition of g≈2.0026(4) with a ($\Delta I/I \approx 10^{-3}$) decrease of the device current. This was confirmed at many other magnetic fields between 2 mT≤$B_0$≤240 mT. FIG. 7, right panel shows the repetition of the measurement shown in the left panel for an RF frequency of v=50 MHz. Again, a MR induced change of the current is visible at g≈2.002, ($B_0 \approx 1.79$ mT) but with diminished amplitude. When $B_0 < B_{hyp}$, a magnetic field $B_{det} = B_0 + B_{off} > B_{hyp}$ can be determined by application of a well defined magnetic DC offset field $B_{off}$ via a DC current in the AC stripline. $B_0$ was then obtained from $B_{det} - B_{off}$.

Figure 8:
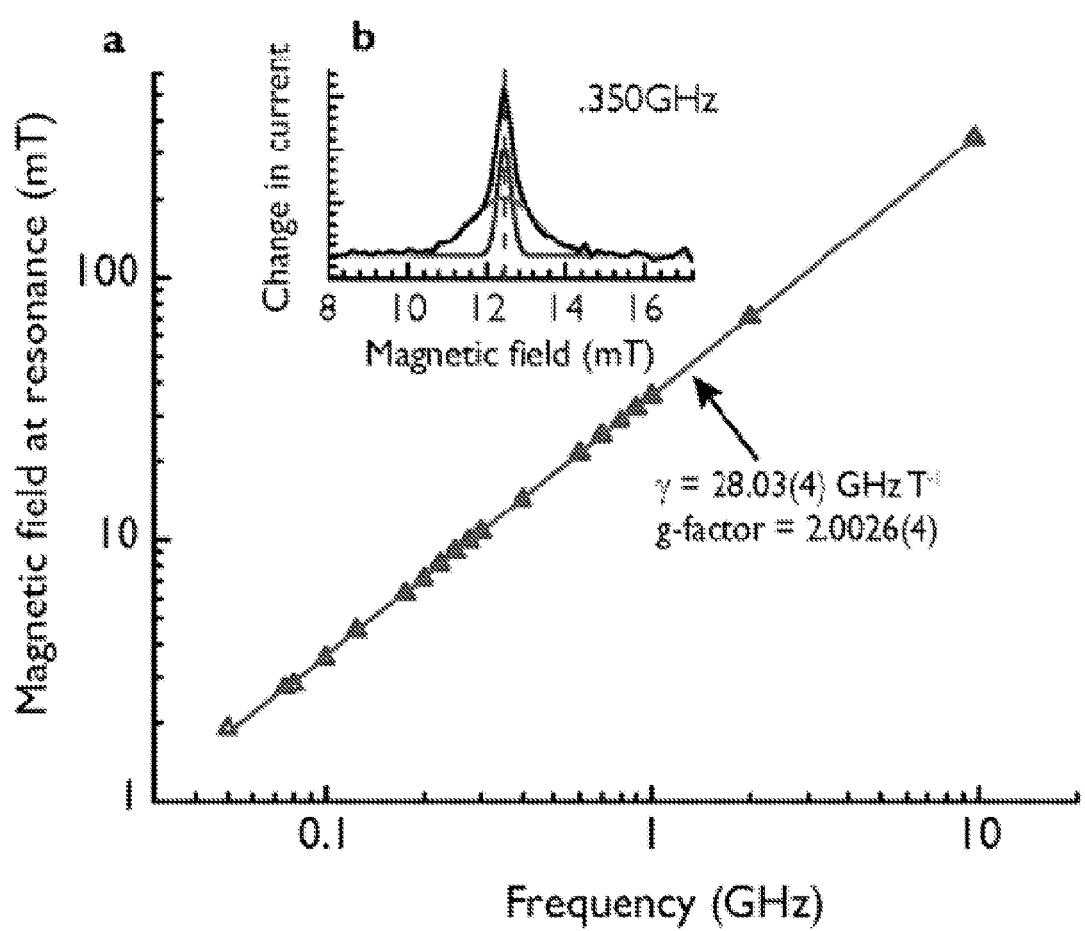
FIG. 8 is a plot of peak magnetic field where maximum magnetic resonance induced current changes were measured as a function of applied external magnetic field. Inset is a corresponding plot of the pulsed EDMR measured resonance spectrum for 0.350 GHz.

The absolute determination of the magnetic field is grounded in the measurement standard, which in this case was the gyromagnetic ratio γ (or Landé-g-factor) of the used resonance line. The set of EDMR measurements conducted on the thin film samples over a large magnetic field range was used in order to determine γ most accurately and also, to confirm the independence of γ from the magnetic field itself. Experimentally, these measurements were performed as $B_0$-dependence measurements for single pulse transient experiments. FIG. 8 displays a plot of the magnetic fields where the maximal current changes were observed as a function of the applied RF frequency. The data was fit by a linear function revealing a value of $\gamma_e = 28.03(4)$ GHz $T^{-1}$. FIG. 8 also shows a reproducibility of this value over nearly three orders of magnitudes (40 MHz-9.7 GHz). The upper limitation of ≈340 mT (≈9.7 GHz) is of purely technical nature related to available equipment. Integrated on-chip microwave generators can be used to extend this measurement range by additional orders of magnitude.

The temperature and degradation dependence of the gyromagnetic ratio was also tested. Results indicated that the magnetic field measurement is independent from the temperature over almost two orders of magnitude. Further, the gyromagnetic ratio was also found to be independent of degradation, although signal amplitude degrades. Thus, the temperature- and degradation independence for any given combination of materials remained consistent.

The widths of the EDMR spectra are not always independent of an applied external magnetic field. EDMR lines can be broadened inhomogeneously (randomly, Gaussian) due to a distribution of spin-orbit interaction as well as random hyperfine fields. Random spin-orbit interaction leads to a randomization of the g-factor, and therefore the corresponding randomization of a resonance line. Consequently, the line width is proportional to the applied $B_0$ field. In contrast, inhomogeneous broadening due to random hyperfine fields is independent of any external magnetic fields as long as the nuclear spin ensemble remains unpolarized by the external field. Thus, for the polaron resonance lines used here, the line widths should be limited by random hyperfine fields and, therefore can be constant at low external magnetic fields and proportional to the external magnetic field when spin-orbit induced line broadening exceeds the hyperfine fields.

The resolution limit for this particular sensor device of $\delta B_{min} \sim 0.05$ $\mu T$ $Hz^{-1/2}$ with a signal to noise of 1 within the hyperfine limited magnetic field range (<100 mT) was calculated. The resolution for larger $B_0$ would be correspondingly larger (i.e. 0.02 to about 0.3 $\mu T$ $Hz^{-1/2}$).

In order to reduce inductive resonances throughout the strip lines across the many orders of magnitude for which is must operate, the MR with the $B_0$ field may be met under the undersaturated and oversaturated conditions. While undersaturation can lead to a weak EDMR response, oversaturation can lead to $B_1$ field induced current artifacts, which will lead to current maxima that may be confused with the MR induced signal current. Because of this, RF modulation (which means frequency or amplitude modulation) of the signal presents difficulties such that only a $B_0$-modulation filters out non-MR induced current artifacts (RF induced and magnetoresistance effects).

Figure 9:
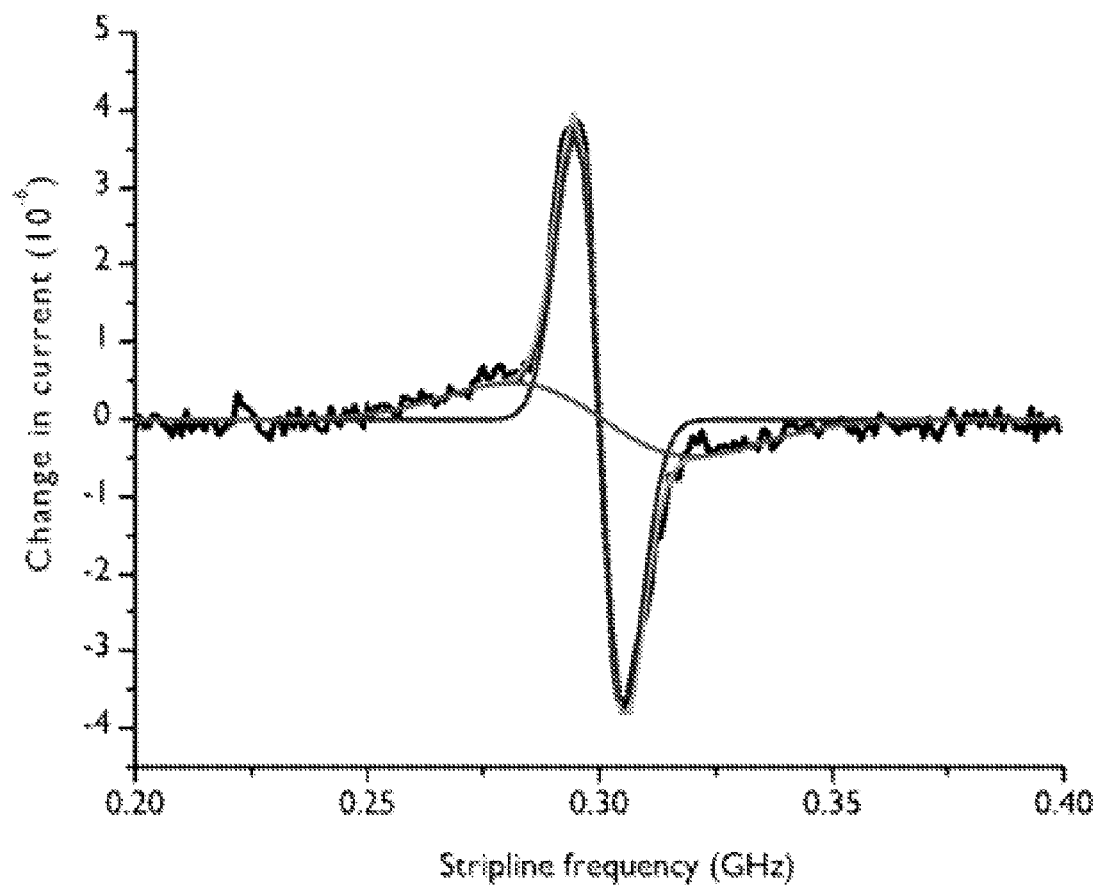
FIG. 9 is a graph of magnetic field modulated device current change as a function of RF frequency in the presence of a static magnetic field (10.7 mT). Two Gaussian resonances were fitted to the measured data (narrow and broad) but both exhibit identical gyromagnetic ratios.

FIG. 9 shows the $B_0$-modulated device current change as the RF frequency was swept while the external magnetic field was held at a constant and arbitrary value. Since lock-in detection was applied, the derivative spectrum in the resonance line is seen. The zero crossing of the measured function is observed at 300.04(4) MHz, corresponding to a $B_0 = 10.704(2)$ mT. From this data, a measurement resolution of 2 $\mu T$ was determined under the given conditions.

Measurement time limitations may be overcome by a combination of the operation of the device with the magnetoresistant behavior of the polymer layer. When the organic device is used in a magnetoresistance mode (e.g. a simple resistance measurement), the magnetic field can be determined approximately with an accuracy that is limited by degradation, temperature. This will strongly limit the measurement range in which the exact magnetic field is then determined subsequently using the current detected magnetic resonance mode. The magnetic fields can be measured at high bandwidth using the magntoresistive effect, while the sensor is used periodically for a recalibration. In essence, such an organic hybrid magnetometer can combine the advantages of both sensor types and approaches the speed of a magnetoresistive measurement with the temperature and degradation independent accuracy of the above sensors.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. An organic, spin-dependent magnetic field sensor, comprising:
   a substrate;
   a back contact formed on the substrate;
   a back injection layer formed on the back contact as part of an active stack, the injection layer being operable to inject a charge into the active stack;
   a back organic semiconductor formed as part of the active stack on the back injection layer, the back organic semiconductor comprising an organic material having a spin-dependence;
   a front organic semiconductor formed as part of the active stack on the back organic semiconductor, the front organic semiconductor comprising an organic material having a spin-dependence;
   a front injection layer formed on the back contact as part of the active stack, the injection layer being operable to inject a charge into the active stack;
   a front contact formed on the front injection layer;
   a spin resonance line formed as a magnetic field generator above the front contact for providing an oscillating magnetic field which penetrates the active stack; and
   an insulator between the front contact and the back contact, and between the front contact and the spin resonance line for preventing electrical shorts between the front contact, back contact, and spin resonance line;
   wherein perturbation of the front and back organic semiconductors modifies at least one of conductivity or luminescence of the front and back organic semiconductors as a result of the spin-dependence.

2. The sensor as in claim 1, wherein the spin-dependency comprises at least one of: polaron pair recombination or dissociation, triplet-triplet annihilation, triplet-polaron recombination or annihilation, and triplet-trion recombination.

3. The sensor of claim 1, wherein the magnetic field generator further comprises a lock-in amplifier conductive strip line, wherein each of the spin resonance line and the lock-in amplifier conductive strip line are electrically insulated from one another.

4. The sensor of claim 1, wherein the magnetic field generator is further configured to produce an offset field parallel to the oscillating magnetic field.

5. The sensor of claim 1, further comprising a plurality of injection layers in the active stack between the front and back contacts and on either side of the organic material for charge injection into the active stack.

6. The sensor of claim 1, wherein the front organic semiconductor is closer to the back contact than the front organic semiconductor and the front organic semiconductor is closer to the front contact than the back organic semiconductor.

7. The sensor of claim 1, wherein the substrate is a flexible substrate and the active stack is supported by the substrate.

8. The sensor of claim 1, wherein the organic material comprises at least one of polyphenylenevinylene (PPV), polythiophene, polyfluorene-vinylene (PIN), polyfluorene (PM), polyacetylene, polypyrrole, polyaniline, cyano-polyphenylene vinylene (CN-PPV), polyphenylene ethynylene (PPE), poly(2,5 pyridine), poly(3,5 pyridine), poly(2,5-bis (3-sulfonatopropoxy)-1,4-phenylene, disodium salt-alt-1,4-phenylene) (PPP), hydrocarbon molecules, porphyrin, and phthalocyanine.

9. The sensor of claim 1, wherein the organic material comprises poly[2-methoxy-5-(2-ethyl-hexyloxy)-1,4-phenylene-vinylene] (MEH-PPV).

10. A magnetic field sensor system, comprising at least three organic, spin-dependent magnetic field sensors as claimed in claim 1, wherein each of the at least three organic, spin-dependent magnetic field sensors includes mutually perpendicular oscillating magnetic fields to form an omni-directional vector magnetometer.

11. A method for identifying a target magnetic field; comprising:
    positioning an organic, spin-dependent magnetic field sensor near the magnetic field;
    applying an oscillating magnetic field on the magnetic field sensor, wherein the oscillating magnetic field penetrates an active stack of the magnetic field sensor;
    sweeping the oscillating magnetic field across a range of magnetic field frequencies;
    applying an electrical current through the active stack;
    measuring the electrical current while sweeping the oscillating magnetic field across the range of magnetic field frequencies, wherein conductivity of the active stack changes as the oscillating magnetic field changes; and
    identifying the target magnetic field when changes to the conductivity of the active stack are the greatest.

12. The method as in claim 11; wherein positioning the organic, spin-dependent magnetic field sensor near the magnetic field comprises positioning the organic, spin-dependent magnetic field sensor at any non-parallel angle with respect to a direction of the magnetic field.

13. The method as in claim 11, further comprising identifying the range of magnetic field frequencies as a subset of a larger range of frequencies using a Hall sensor.

14. The method as in claim 11, wherein the conductivity of the active stack changes as a frequency of the uniform, oscillating magnetic field approaches a resonance frequency corresponding to the target magnetic field and causes resonance in the organic spin-dependent magnetic field sensor.

15. The method as in claim 11, further comprising measuring spatially varying target magnetic fields using an array of organic spin-dependent magnetic field sensors.

16. The method as in claim 11, wherein identifying the target magnetic field comprises calculating a target magnetic field B according to the relationship $B=\alpha f$, where f is a frequency of the uniform, oscillating magnetic field and a is an organic material constant that is constant in temperature and applied current.

17. The method as in claim 11, further comprising identifying the target magnetic field at room temperature.

18. The method as in claim 11, further comprising identifying the target magnetic field at cryogenic temperatures.

* * * * *